United States Patent
Wada et al.

(10) Patent No.: US 9,117,738 B2
(45) Date of Patent: Aug. 25, 2015

(54) INTERCONNECTION OF SEMICONDUCTOR DEVICE WITH GRAPHENE WIRE

(71) Applicant: KABUSHIKI KAISHA TOSHIBA, Minato-ku, Tokyo (JP)

(72) Inventors: Makoto Wada, Yokohama (JP); Hisao Miyazaki, Yokohama (JP); Akihiro Kajita, Yokkaichi (JP); Atsunobu Isobayashi, Yokkaichi (JP); Tatsuro Saito, Yokkaichi (JP); Tadashi Sakai, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 84 days.

(21) Appl. No.: 13/966,164

(22) Filed: Aug. 13, 2013

(65) Prior Publication Data

US 2014/0231751 A1    Aug. 21, 2014

(30) Foreign Application Priority Data

Feb. 15, 2013    (JP) .................. 2013-027925

(51) Int. Cl.

| H01L 29/16 | (2006.01) |
|---|---|
| H01L 21/768 | (2006.01) |
| H01L 21/3215 | (2006.01) |
| H01L 23/532 | (2006.01) |
| H01L 27/105 | (2006.01) |

(52) U.S. Cl.
CPC ........ *H01L 29/1606* (2013.01); *H01L 21/3215* (2013.01); *H01L 21/76805* (2013.01); *H01L 21/76876* (2013.01); *H01L 21/76885* (2013.01); *H01L 21/76886* (2013.01); *H01L 23/53276* (2013.01); *H01L 27/1052* (2013.01); *H01L 2924/0002* (2013.01)

(58) Field of Classification Search
CPC .................................................. H01L 29/1606
See application file for complete search history.

(56) References Cited

U.S. PATENT DOCUMENTS

| 7,015,142 | B2 * | 3/2006 | DeHeer et al. ................ 438/689 |
|---|---|---|---|
| 7,071,258 | B1 * | 7/2006 | Jang et al. ..................... 524/496 |
| 7,728,405 | B2 * | 6/2010 | Kreupl .......................... 257/528 |
| 8,337,949 | B2 * | 12/2012 | Choi et al. ..................... 427/227 |
| 8,358,008 | B2 | 1/2013 | Wada et al. |
| 8,535,553 | B2 * | 9/2013 | Kong et al. ...................... 216/95 |
| 8,889,298 | B2 * | 11/2014 | Zhamu et al. .............. 429/231.8 |
| 8,969,154 | B2 * | 3/2015 | Sandhu ......................... 438/268 |
| 2011/0006425 | A1 | 1/2011 | Wada et al. |
| 2012/0068160 | A1 | 3/2012 | Yamazaki et al. |
| 2012/0080661 | A1 | 4/2012 | Saito et al. |
| 2012/0080662 | A1 | 4/2012 | Saito et al. |
| 2012/0228614 | A1 | 9/2012 | Kitamura et al. |

FOREIGN PATENT DOCUMENTS

JP    2012-054303 A    3/2012

* cited by examiner

*Primary Examiner* — Thanh V Pham
(74) *Attorney, Agent, or Firm* — Holtz, Holtz, Goodman & Chick PC (57) ABSTRACT

According to one embodiment, a semiconductor device using multi-layered graphene wires includes a substrate having semiconductor elements formed therein, a first graphene wire formed above the substrate and including a multi-layered graphene layer having a preset impurity doped therein, a second graphene wire formed on the same layer as the first multi-layered graphene wire above the substrate and including a multi-layered graphene layer into which the preset impurity is not doped, a lower-layer contact connected to the undersurface side of the first multi-layered graphene wire, and an upper-layer contact connected to the upper surface side of the second multi-layered graphene wire.

4 Claims, 6 Drawing Sheets

INTERCONNECTION OF SEMICONDUCTOR DEVICE WITH GRAPHENE WIRE

CROSS-REFERENCE TO RELATED APPLICATIONS

This application is based upon and claims the benefit of priority from Japanese Patent Application No. 2013-027925, filed Feb. 15, 2013, the entire contents of which are incorporated herein by reference.

FIELD

Embodiments described herein relate generally to a semiconductor device using multi-layered graphene wires.

BACKGROUND

Recently, much attention has been given to graphene wires using graphene instead of metal wires. Graphene is a novel carbon material obtained by making graphite extremely thin. Like a carbon nano-tube, graphene has quantization conductivity (ballistic conductivity) and realizes quantization conductivity. Therefore, it is advantageous to use the same as a long-distance wire from the viewpoint of electrical conduction. Further, the graphene structure itself is an extremely thin film and can be formed by use of the CVD method. As a result, graphene has excellent matching with respect to a device wire formation process.

When graphene is used for an LSI wire structure, a multi-layered graphene structure obtained by laminating graphene layers in a multi-layered form is used. As a method for further reducing the resistance of the multi-layered graphene structure, it is effective to apply a technique for adding a different element into the graphene layer. For example, the mobility of carriers (electrons or holes) in a graphene sheet is raised by adding an element such as Br in between graphene layers and thus the resistance thereof can be reduced.

However, Br or the like that is an effective candidate as an additive element reacts with a metal material of W or Ti represented as a via material of an LSI wire and may etch and corrode the metal wire. Particularly, a significant problem occurs in a contact that lies on the upper-layer side of the graphene wire and is formed in direct contact with the multi-layered graphene wire.

DETAILED DESCRIPTION

In general, according to one embodiment, a semiconductor device using multi-layered graphene wires comprises a substrate having semiconductor elements formed therein, a first graphene wire formed above the substrate and including a multi-layered graphene layer having a preset impurity doped therein, a second graphene wire formed on the same layer as the first multi-layered graphene wire above the substrate and including a multi-layered graphene layer into which the preset impurity is not doped, a lower-layer contact connected to the undersurface side of the first multi-layered graphene wire, and an upper-layer contact connected to the upper surface side of the second multi-layered graphene wire.

Next, semiconductor device of the embodiments are explained with reference to the accompanying drawings.

First Embodiment

Figure 1:
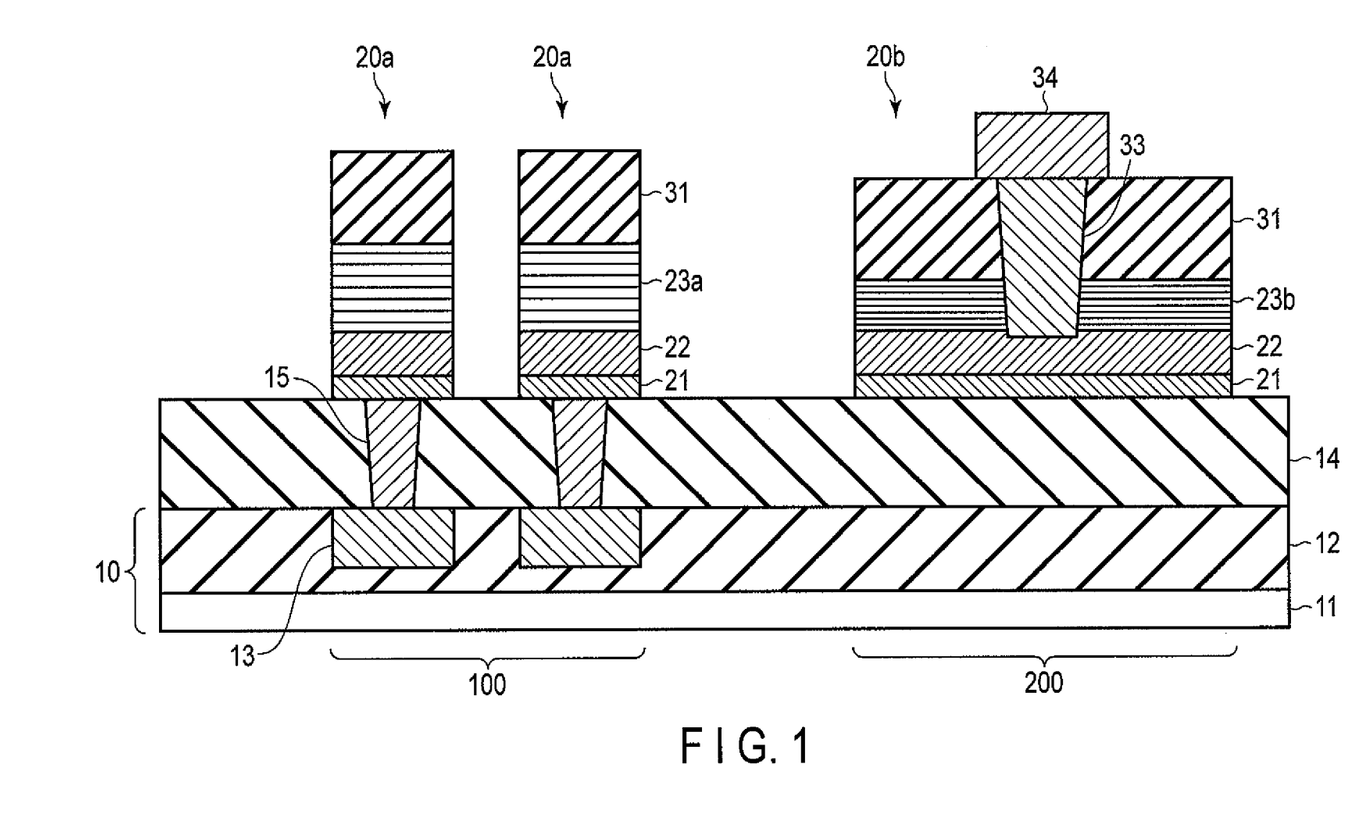
FIG. 1 is a cross-sectional view showing the schematic structure of a semiconductor device according to a first embodiment.

FIG. 1 is a cross-sectional view showing the schematic structure of a semiconductor device according to a first embodiment. In the drawing, particularly, a wiring portion in a memory cell region of a semiconductor memory device and a wiring portion in a peripheral circuit region are shown.

On a substrate 10 having semiconductor elements such as transistors and capacitors formed therein, an interlayer insulating film 14 and contact vias (lower-layer contacts) 15 are formed. For example, the substrate 10 is obtained by forming semiconductor elements such as memory elements and various circuit elements in an Si substrate 11 and forming an interlayer insulating film 12 and wiring layers 13 on the Si substrate 11. The lower-layer contacts 15 are formed in contact with the wiring layers 13 and electrically connected to the semiconductor elements in the Si substrate 11 via the wiring layers 13.

The substrate 10 may be obtained by forming semiconductor elements such as magnetic-change memory elements or ion-change memory elements on the Si substrate 11. In this case, the memory elements are formed instead of the wiring layers 13 in FIG. 1 and the memory elements are connected to the respective lower-layer contacts 15.

A plurality of multi-layered graphene wires are formed on the interlayer insulating film 14 and lower-layer contacts 15 and portions of the multi-layered graphene wires are connected to the lower-layer contacts 15. That is, the structure in which first multi-layered graphene wires 20a on a memory cell region 100 are connected to the lower-layer contacts 15 and second multi-layered graphene wires 20b on a peripheral circuit region 200 are not connected to the lower-layer contacts 15.

Each of the multi-layered graphene wires 20a, 20b includes a catalytic underlying layer 21 that accelerates the growth of a graphene layer, a catalytic metal layer 22 used for growing graphene and a multi-layered graphene layer 23 (23a, 23b) that is responsible for electrical conduction. The graphene underlying layer 21 is a layer used for uniformly accelerating the growth of the multi-layered graphene layer 23 and has a function as a catalytic promoter used for growing a graphene layer.

As a representative catalytic underlying layer material, Ti, Ta, Ru, W and the nitride thereof are used. Alternatively, the metal oxide thereof may be used. Further, it is possible to laminate the above films and use the thus laminated film. As a catalytic metal material, a single metal such as Co, Ni, Fe, Ru or Cu, an alloy including at least one of the above metals or a carbide or the like of the above metals can be preferably used.

The catalytic metal layer 22 is preferably a continuous film and the film thickness of at least 0.5 nm is required to form a continuous film. In a state in which the catalytic metal layer 22 is dispersed and formed into fine grains, graphene itself will not smoothly grow or a graphene layer may be formed discontinuous. Therefore, in order to form a uniform and continuous graphene layer, it is necessary to form the catalytic metal layer 22 with such a film thickness as to become continuous.

Above the catalytic metal layer 22, a multi-layered graphene layer 23 is formed. The multi-layered graphene layer 23 has an extremely thin film structure obtained by laminating a graphite film of one layer to several tens of layers. The multi-layered graphene layer 23 is formed by use of the thermal CVD method or plasma CVD method at 450° C. or more. As source gas for the CVD method, for example, methanol, ethanol, acetylene or the like is used. Since the density of defects contained in the graphene sheet is reduced more as the growth temperature of graphene becomes higher, the high-temperature film formation process is preferably performed.

However, generally, if the high-temperature film formation process of 700° C. or more is performed, surface condensation may occur on a metal layer of, for example, Co or Ni that is the lower-layer catalytic metal layer 22 in the thermal process for graphene film formation. If the surface condensation is significant, the catalytic metal layer 22 may become discontinuous and, at this time, the multi-layered graphene layer 23 formed on the catalytic metal layer 22 may also become discontinuous. If graphene is grown, for example, at the high temperature of 800° C. or more to prevent the above problem, the catalytic metal layer 22 may be formed as an alloy catalytic layer obtained by adding a refractory metal such as W, Mo or Ir into the layer 22. Further, a method for subjecting the catalytic metal layer 22 to a nitriding process to form a metal compound is effectively used.

On the multi-layered graphene wires 20a, 20b, surface protection layers 31 are formed to cover the above wires. For example, the surface protection layer 31 is formed of an SiN or $SiO_2$ film and is formed by use of the CVD method or the like. The surface protection layer 31 is used as a processing hard mask for processing the multi-layered graphene layer 23, catalytic metal layer 22 and catalytic underlying film 21, and additionally, plays a role of preventing oxidation of a wiring layer material containing multi-layered graphene. Further, it is possible to use the surface protection layer 31 as an interlayer insulating film with respect to the upper-layer wire or as a portion of the interlayer insulating film when a contact layer is formed on the upper layer of the wiring structure.

On the peripheral circuit region 200, a contact via (upper-layer contact) 33 is formed in the surface protection layer 31. Then, a wiring layer 34 is formed on the surface protection layer 31 to be connected to the contact via 33.

As a halogen-series element, for example, Br is added into the multi-layered graphene layers 23a provided on the memory cell region 100 side and connected to the lower-layer contacts 15 via the catalytic underlying layers 21 and catalytic metal layers 22. In this case, the additive element is not necessarily limited to Br and I, F, Cl or the like can be used. F may be added in the form of $F_5As$. The additive element may form a superlattice structure together with graphene. If a superlattice structure is provided, the carrier mobility of a graphene sheet may be further raised. In a memory structure as represented by a NAND flash memory, wires of an element portion used in the element region are particularly finely formed for device high integration. Further, lower-layer contacts are formed for the wires to drive a lower-layer memory element. By using doping graphene wires in the element region, the wiring resistance of the element portion wire that is particularly finely formed can be reduced.

On the other hand, an additive element such as Br is not doped in the multi-layered graphene layer 23b provided on the peripheral circuit region 200 side and directly connected to the upper-layer contact 33. That is, the wire on which the upper-layer contact 33 is formed is not doped and thus the doping regions are divided. As a result, no additive element is present on the upper-layer contact side. Therefore, a structure that does not react with a contact metal to corrode the same when the contact metal is formed and has a graphene layer and contact metal formed in direct contact with each other is formed. Thus, a preferable wire-contact characteristic can be attained.

In a memory structure as represented by a NAND flash memory, a contact can be formed from the upper-layer side on the peripheral circuit wire used in the peripheral circuit portion configured to control the memory element. The peripheral circuit wire on which the upper-layer contact is formed is not doped. Since the peripheral circuit wire is generally formed wider than the element portion wire, low wire resistance can be attained without doping.

As shown in FIG. 1, in the multi-layered graphene layer 20b that is doped, the height thereof is increased in the height direction.

Thus, according to this embodiment, the resistance of the wire 20a can be reduced by doping Br in the multi-layered graphene layer 23a of the first multi-layered graphene wire 20a of the memory cell region 100. Since Br is not doped in the multi-layered graphene layer 23b of the second multi-layered graphene wire 20b of the peripheral circuit region 200, etching and corrosion of the contact 33 can be prevented even if the upper-layer contact 33 is connected to the wire 20b of the peripheral portion. Therefore, the resistance of the graphene wiring structure can be reduced without causing etching and corrosion of the metal material. As a result, the element characteristic can be enhanced.

Second Embodiment

Next, the manufacturing method for realizing the structure of FIG. 1 of the first embodiment is explained with reference to FIGS. 2A to 2E.

Figure 2A:
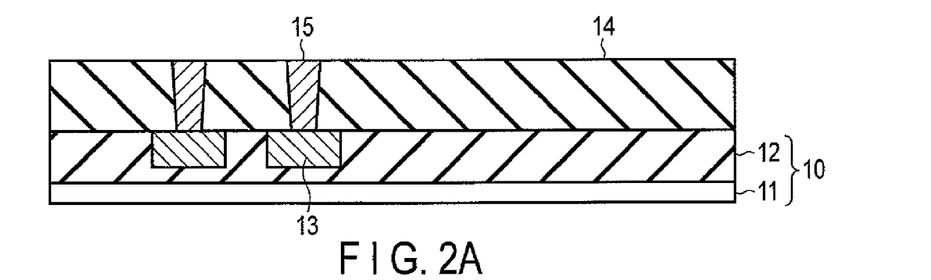
FIGS. 2A to 2E are cross-sectional views showing manufacturing steps of a semiconductor device according to a second embodiment.

First, as shown in FIG. 2A, an interlayer insulating film 14 is formed on a substrate 10 having desired semiconductor elements formed therein and contact vias (lower-layer contacts) 15 are formed in portions of the interlayer insulating film 14. For example, the substrate 10 is obtained by forming semiconductor elements such as memory elements and various circuit elements in an Si substrate 11 and forming an interlayer insulating film 12 and wiring layers 13 on the structure. The lower-layer contacts 15 are connected to the wiring layers 13 and are electrically connected to the semiconductor elements in the Si substrate 11 via the wiring layers 13.

Figure 2B:
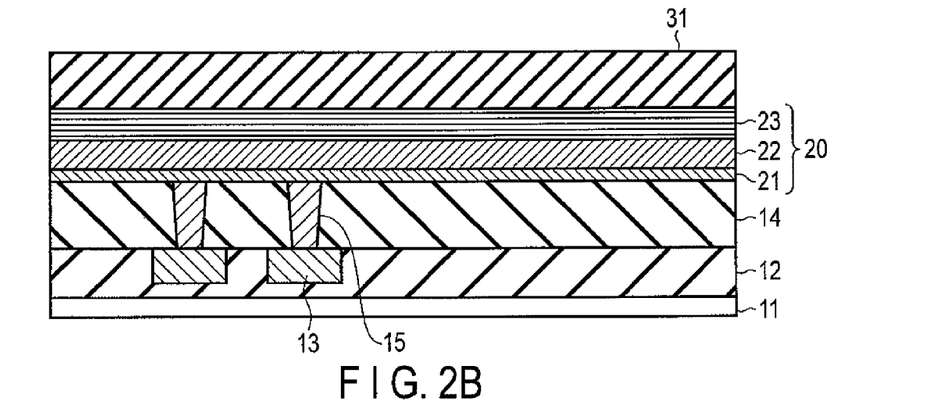

Next, as shown in FIG. 2B, a graphene wiring structure 20 formed of a catalytic underlying layer 21, catalytic metal layer 22 and multi-layered graphene layer 23 is formed on the interlayer insulating film 14 and contact vias 15. Then, a surface protection layer 31 is formed on the graphene wiring structure 20.

Specifically, the catalytic underlying layer 21 formed of, for example, Ti is first formed on the interlayer insulating film 14 and contact vias 15 and then the catalytic metal layer 22 of 0.5 nm or more consisting of, for example, Co is formed on the above layer. Next, the multi-layered graphene layer 23 obtained by laminating a plurality of layers of extremely thin graphite films is formed on the catalytic metal layer 22 by use of the plasma CVD method at 450° C. or more. Then, the surface protection layer 31 formed of, for example, $SiO_2$ is formed on the multi-layered graphene layer 23.

Figure 2C:
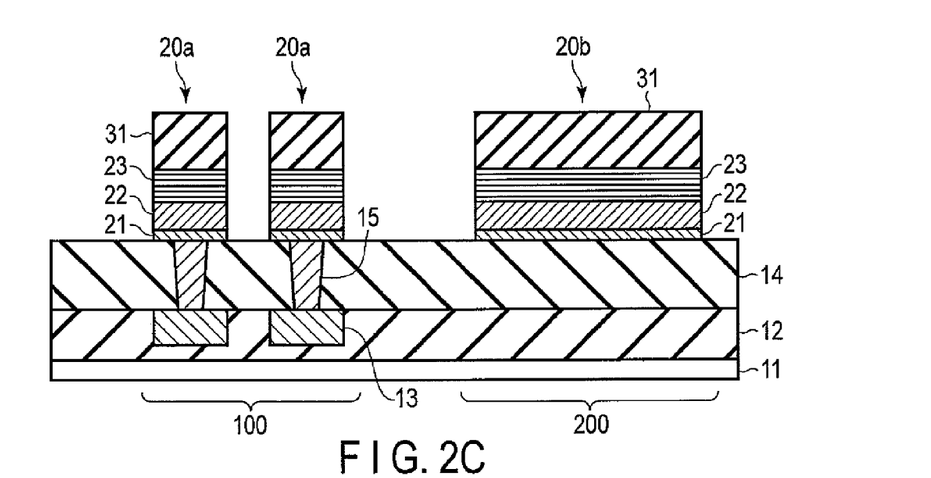

Next, as shown in FIG. 2C, the surface protection layer 31, multi-layered graphene layer 23, catalytic metal layer 22 and catalytic underlying layer 21 are formed into a desired wiring shape by use of lithography, an RIE process and a wet process. In the RIE process at this time, for example, gas such as Co, H₂ or the like that is doped into graphene without reacting with graphene is used. In the memory cell region 100, first multi-layered graphene wires 20a connected to the lower-layer contacts 15 are formed. In the peripheral circuit region 200, a second multi-layered graphene wire 20b that is not connected to the lower-layer contact 15 is formed.

Figure 2D:
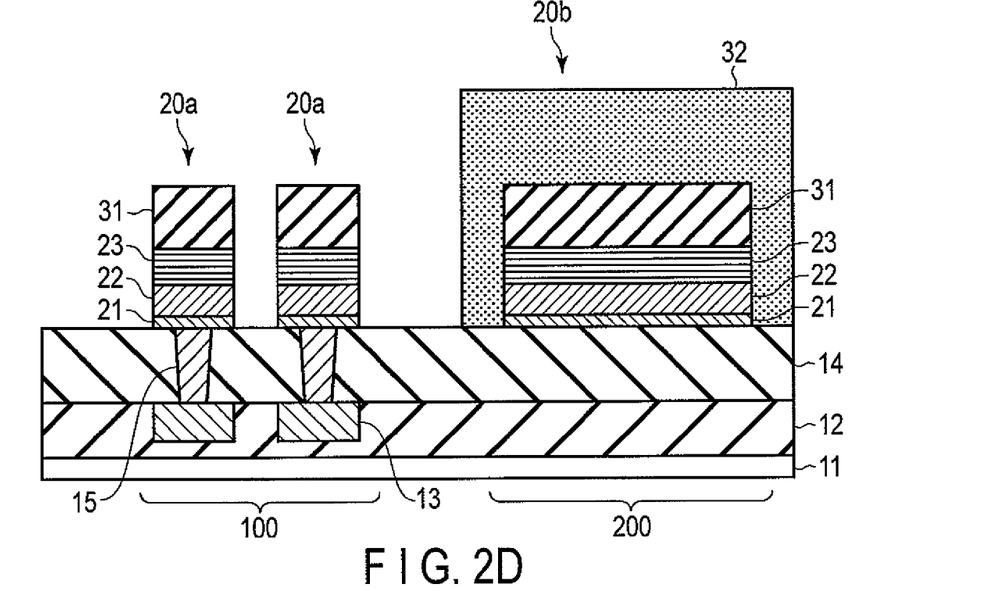

Next, as shown in FIG. 2D, the graphene wire 20b that is not doped and on which the upper-layer contact is formed is subjected to a patterning process by use of, for example, a photoresist film 32 to form a mask. As a result, a wiring region that is doped and a wiring region that is not doped are divided.

Figure 2E:
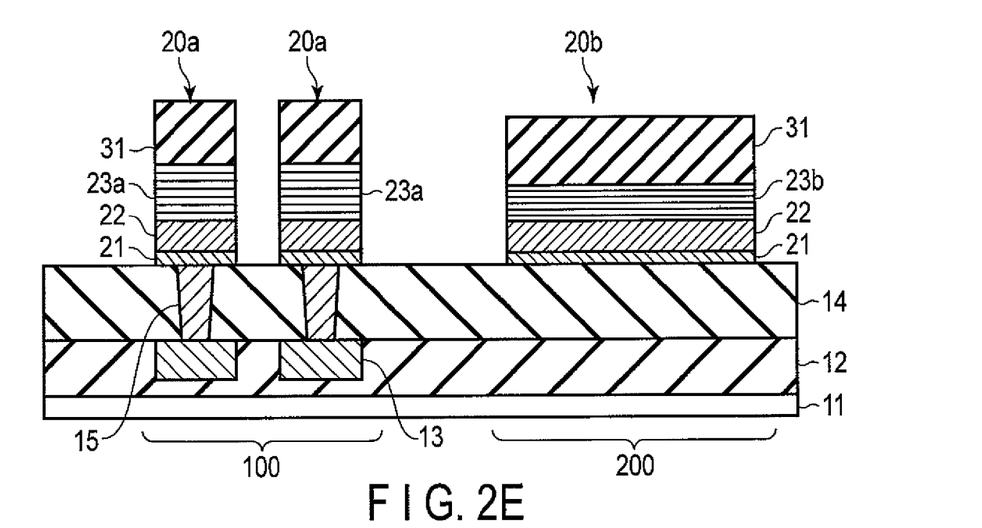

Next, as shown in FIG. 2E, for example, Br is gas-flowed as an additive element. If the temperature is raised, the additive element may react with the catalytic metal to etch the catalytic metal. Therefore, it is preferable to perform the gas flow at room temperature. Further, it is also preferable not to apply a bias. The graphene layer can be doped without etching the catalytic metal by performing the gas flow at room temperature. The additive element is not doped on the side of the second multi-layered graphene wire 20b that is masked with the resist film 32. Finally, the resist film 32 is removed and the doping graphene wire and the graphene wire that is not doped can be formed by use of the same layer of LSI. After this, an upper-layer contact 33 and upper-layer wire 34 are formed on the multi-layered graphene wire 20b having the upper-layer contact connected to the upper-layer wire.

Third Embodiment

Figure 3:
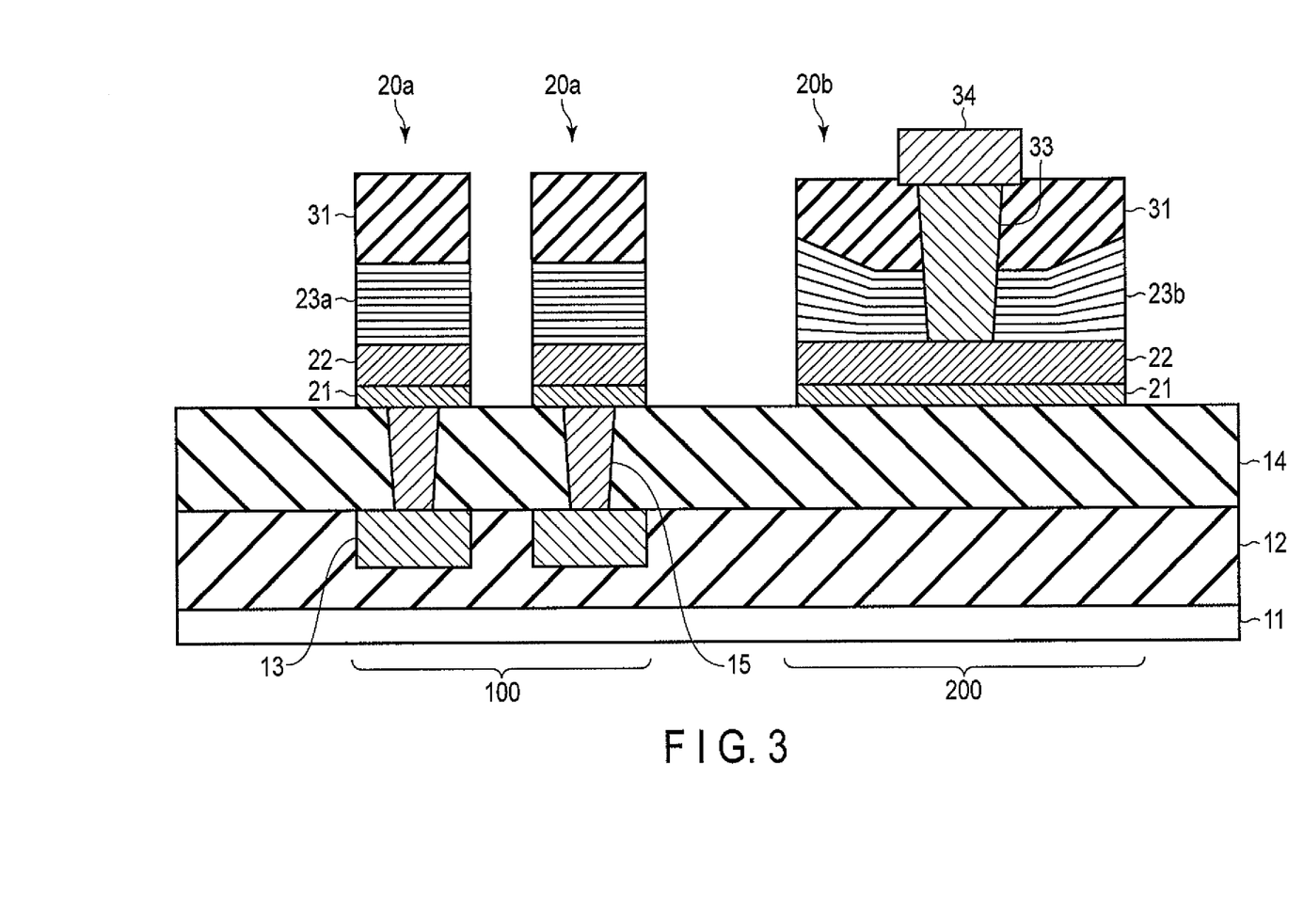
FIG. 3 is a cross-sectional view showing the schematic structure of a semiconductor device according to a third embodiment.

In the second embodiment, the regions of impurity doping are divided by use of the mask pattern. However, as shown in FIG. 3, the regions may be divided by controlling the doping concentration profile. That is, an additive element is doped in the entire region in a wire width direction of a multi-layered graphene wire 20a of a memory cell region 100 connected to a lower-layer contact 15. On the other hand, an additive element is doped only in an edge region so as not to reach a region that is formed in contact with a contact 33 in a wire 20b of a peripheral circuit region 200 connected to the upper-layer contact 33.

Figure 4A:
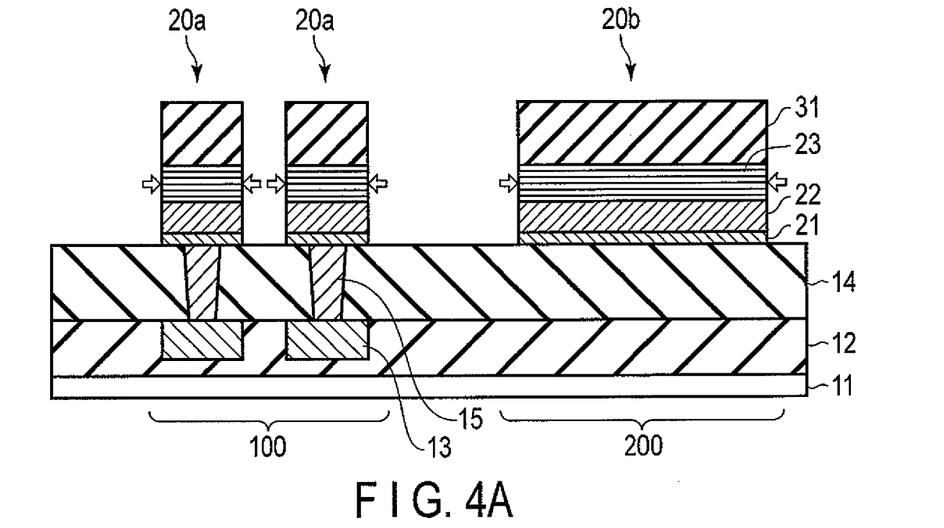
FIGS. 4A, 4B are cross-sectional views showing manufacturing steps of the semiconductor device of FIG. 3.
Figure 4B:
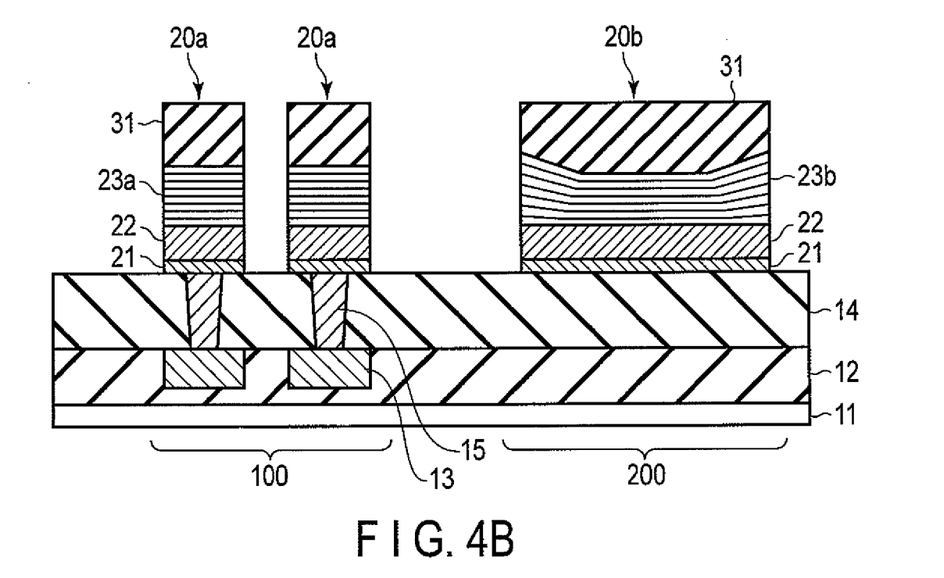

The process of making the above doping concentration difference can be realized by controlling the time and flow rate of gas flow of additive element Br. Specifically, like the case of FIG. 2C, impurity is doped into a multi-layered graphene layer 23 by gas flow after forming a wiring pattern as shown in FIG. 4A. At this time, the width of the second multi-layered graphene wire 20b is larger than that of the first multi-layered graphene wire 20a. Therefore, as shown in FIG. 4B, the entire portion of the first multi-layered graphene wire 20a is doped by controlling the time and flow rate of gas flow and only a portion near the edge of the second multi-layered graphene wire 20b is doped.

At this time, since the physical distance between the graphene layers of the doped portions is increased, a structure in which the edge portion of the second multi-layered graphene wire 20b expands as shown in FIG. 3 is obtained. Further, since this is a diffusion phenomenon, the doping concentration becomes lower towards the center and the inter-layer distance is reduced towards the center. Therefore, a portion of the graphene layer 23b is inclined.

As described above, in this embodiment, since the whole portion of the multi-layered graphene layer 23a is formed of a doping layer in the first multi-layered graphene wire 20a as in the first embodiment, the wiring resistance can be reduced. Since only the edge portion of the multi-layered graphene layer 23b is formed of a doping layer in the second multi-layered graphene wire 20b, but the central portion thereof is non-doped, etching and corrosion of the upper-layer contact 33 can be prevented. Therefore, the same effect as that of the first embodiment can be attained.

Further, it is advantageous to reduce the wiring resistance in a case wherein the edge portion of the second multi-layered graphene wire 20b is doped with Br than in a case wherein the whole portion is non-doped. It is advantageous to simplify the process since doping can be performed without using a mask such as a photoresist film.

Fourth Embodiment

This embodiment is a method for simultaneously performing patterning and doping processes instead of doping impurity after a multi-layered wiring structure is patterned into a wiring pattern.

Figure 5:
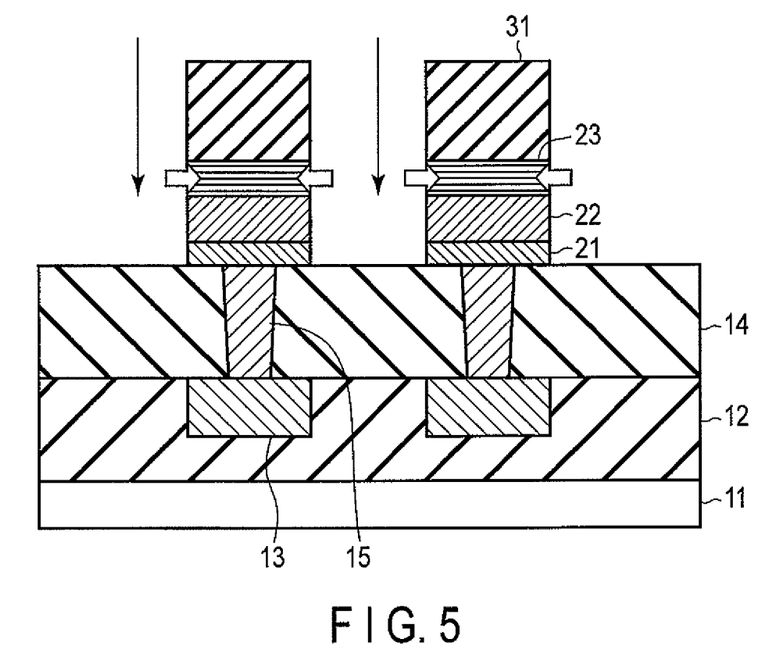
FIG. 5 is a cross-sectional view for illustrating a manufacturing process of a semiconductor device according to a fourth embodiment.

In the etching step shown in FIG. 2C, gas containing a halogen element of, for example, Br, F₅As, I, Cl or the like as an additive agent is used as RIE etching gas. As shown in FIG. 5, the wire formation process of a multi-layered graphene wiring structure 20 and the doping process for a multi-layered graphene layer 23 can be simultaneously performed by using the above etching gas.

Specifically, a patterning process is separately performed for a memory cell region 100 and peripheral circuit region 200. Further, at the patterning time for the memory cell region 100, an RIE process is performed by use of gas containing the above halogen element as an additive agent. At the patterning time for the peripheral circuit region 200, an RIE process is performed by use of gas containing Co, H₂ or the like as an additive agent.

The memory cell region 100 and peripheral circuit region 200 can be simultaneously patterned by use of a difference in the widths of a first multi-layered graphene wire 20a and second multi-layered graphene wire 20b. That is, gas containing a halogen element of, for example, Br, F₅As, I, Cl or the like as an additive agent is used as RIE etching gas. As a result, like the third embodiment, the whole portion is doped in the first multi-layered graphene wire 20a and only the edge portion is doped in the second multi-layered graphene wire 20b.

Thus, in this embodiment, the first multi-layered graphene wire 20a that is doped and the second multi-layered graphene wire 20b that is not doped (or only the edge portion thereof is doped) can be realized and the same effect as that of the first embodiment can be attained. Additionally, since doping can be performed at the patterning time of the multi-layered wiring structure by selection of RIE gas, the process can be simplified and the cost of the manufacturing process can be reduced.

(Modification)

This invention is not limited to the above embodiments.

In the embodiments, Br is used as a halogen-series element, but it is also possible to use I, F or Cl.

Further, it is possible to perform the doping process for the memory cell region and the non-doping process for the peripheral circuit region instead of doping the whole portion of the multi-layered graphene wire connected to the lower-layer contact and non-doping the whole portion of the multi-layered graphene wire connected to the upper-layer contact. That is, the doping process can be selectively performed according to the memory cell region or the peripheral circuit region instead of selectively performing the doping process according to whether the wire is connected to the lower-layer contact or connected to the upper-layer contact. Since the number of wires connected to the lower-layer contacts is large in the memory cell region and the number of wires connected to the upper-layer contacts is large in the peripheral circuit region, it is effective to selectively perform the doping process for the respective regions as described above.

Further, materials of the catalytic underlying layer, catalytic metal layer and graphene layer can be adequately changed according to the specification. If a graphene layer uniformly grows only on the catalytic metal layer, the catalytic underlying layer can be omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate having semiconductor elements formed therein,
   a first multi-layered graphene wire formed above the substrate, the first multi-layered graphene wire including a multi-layered graphene layer having a preset impurity doped therein,
   a second multi-layered graphene wire formed on the same layer as the first multi-layered graphene wire above the substrate, the second multi-layered graphene wire formed wider than the first multi-layered graphene wire and including a multi-layered graphene layer in an edge portion of which the impurity is selectively doped,
   a lower-layer contact connected to the undersurface side of the first multi-layered graphene wire, and
   an upper-layer contact connected to the upper surface side of the second multi-layered graphene wire; and
   wherein each of the first and second multi-layered graphene wires includes a sequentially laminated catalytic underlying layer, catalytic metal layer and the multi-layered graphene layer from the lower-layer side.

2. The device according to claim 1, wherein the impurity is one of Br, I, F and Cl.

3. The device according to claim 1, wherein the lower-layer contact is connected to the semiconductor element via a wire on the lower-layer side of the multi-layered graphene wire and the upper-layer contact is connected to a wire on the upper-layer side of the multi-layered graphene wire.

4. The device according to claim 1, wherein the first multi-layered graphene wire is arranged in a memory cell region and the second multi-layered graphene wire is arranged in a peripheral circuit region.

* * * * *